United States Patent [19]

Meyer et al.

[11] Patent Number: 4,566,132
[45] Date of Patent: Jan. 21, 1986

[54] MULTIFUNCTION ULTRA-HIGH FREQUENCY CIRCUIT AND MEANS USING SUCH A CIRCUIT

[76] Inventors: Sylvain Meyer, 36 Résidence duroux, 22300 Lannion; Michel Goloubkoff, Penvern, 22560 Pleumeur Bodou; Jean Guéna, 30 Cité Morgane, 22560 Trébeurden, all of France

[21] Appl. No.: 456,091

[22] Filed: Jan. 6, 1983

[30] Foreign Application Priority Data

Jan. 8, 1982 [FR] France ................................ 82 00194

[51] Int. Cl.⁴ .............................................. H04B 1/40
[52] U.S. Cl. ..................................... 455/86; 455/327; 455/330
[58] Field of Search ...................... 455/84, 85, 86, 118, 455/330, 327; 333/247; 343/385, 386

[56] References Cited

U.S. PATENT DOCUMENTS 3,328,694  6/1967  Brady et al. .......................... 455/86
3,636,453  1/1972  George .
3,867,699  2/1975  Stoffer ................................... 455/86
4,163,232  7/1979  Fitzsimmons .
4,301,432  11/1981 Carlson et al. .
4,353,127  10/1982 Richardson ........................... 455/86

OTHER PUBLICATIONS

Japanese Abstract, vol. 1, No. 21, 25.3.1977, p. 835 (E76).
Japanese Abstract, vol. 2, No. 124, 18.10.1978, p. 7350 (E78).

Primary Examiner—Theodore M. Blum
Attorney, Agent, or Firm—Pearne, Gordon, Sessions, McCoy, Granger & Tilberry

[57] ABSTRACT

A multifunction ultra-high frequency circuit and bidirectional transmission means using such a circuit. The circuit according to the invention comprises a directional coupler, two diodes, a transistor and an access connected to the diodes. The state of the transistor defines several functions of the circuit: modulation, mixing and transmission-reception separation. Application to half-duplex transmission.

6 Claims, 9 Drawing Figures

FIG.6 III

MULTIFUNCTION ULTRA-HIGH FREQUENCY CIRCUIT AND MEANS USING SUCH A CIRCUIT

BACKGROUND OF THE INVENTION

The present invention relates to a multi-function ultra-high frequency circuit and means using such a circuit.

The invention relates to the field of telecommunications and particularly to the radio distribution of data, multiple input or input communications systems with time sharing, interactive broadcasting systems (high flow rate channel for broadcasting and low flow rate channel for return) digital or analog transmission means, etc.

The term ultra-high frequency is understood to mean the range extending beyond approximately 1 GHz and which is generally about 10 to 20 GHz.

A conventional transmitter-receiver means operating in duplex (simultaneous transmission and reception) is shown in FIG. 1. Such a means comprises an ultra-high frequency transmission source 10, a modulator 12 receiving at an input 14 a data stream to be transmitted, a mixer 16 connected to the modulator and receiving at an input 18 a wave supplied by a frequency conversion oscillator 20, a transmission amplifier 22, means 24 for the separation between the transmission wave and the reception wave, an antenna 26 connected to said means, a receiving amplifier 28, a receiving mixer 30 connected to the aforementioned amplifier and receiving a reception wave, a source 32 producing said wave, an amplifier and detector chain 34 operating at an intermediate frequency equal to the difference between the reception frequency and that of source 32, said chain supplying a data stream at an output 36.

Such a known installation functions simultaneously in transmission and reception. It is therefore relatively complex, because it comprises two complete subassemblies, one for transmission and the other for reception.

BRIEF SUMMARY OF THE INVENTION

The object of the present invention is to simplify such means, by reducing the number of components. This is achieved by using a circuit, which can fulfil several of the aforementioned functions, namely modulation, mixing and transmission-reception separation.

The circuit according to the invention can function as a modulator on transmission and as a mixer on reception. This naturally presupposes that the means used operates alternately in transmission and reception. Such a so-called half-duplex mode is already known in the field of cable transmission, but is not used in radio transmission. Moreover, the half-duplex operating mode is conventionally used to permit working with a single transmission line (generally on symmetrical pairs). According to the invention, the sought objective differs, because it is a question of reducing the number of ultra-high frequency components in the transmission-reception stations.

The circuit according to the invention essentially uses three ultra-high frequency components, namely a directional coupler and two diodes, or more generally two elements with non-linear characteristics. It fulfils three different types of function, as a function of the signal applied to its accesses or inputs.

Such a circuit makes it possible to realise transmitters-receivers for bidirectional transmission systems and repeaters for this type of system. The advantages of such means are their simplicity resulting from the small number of components used and consequently their low cost and good reliability. It is pointed out that the higher the frequency, the more expensive the components. Therefore, the invention is of particular interest at the top of the ultra-high frequency range. Naturally, however, the bottom of the range is not excluded.

More specifically, the present invention relates to a multifunction ultra-high frequency circuit, wherein it comprises:

a 3 dB directional coupler having a first pair of accesses and a second pair of accesses, the first pair always being matched, but the decoupling between the accesses of this pair is high for a special matching value of the impedances to the accesses of the second pair;

a branch having in series a first diode, a transistor and a second diode, the transistor having a base connected to an access for controlling its conductive or blocking state, an emitter connected across a first rejection inductor to one of the diodes and a collector connected via a second rejection inductor to the other diode, said branch being connected between the accesses of the second pair of accesses of the coupler and having impedances equal to said special matching value when the transistor is in the conductive state;

two lines having at least one quarter-wave element connecting the earth to the two diodes;

an output access connected to the two diodes across two capacitors.

BRIEF DESCRIPTION OF THE DRAWINGS

The invention is described in greater detail hereinafter relative to non-limitative embodiments and the attached drawings, with the exception of FIG. 1 which has already been described, wherein show.

DETAILED DESCRIPTION OF THE PREFERRED EMBODIMENTS

Figure 1:
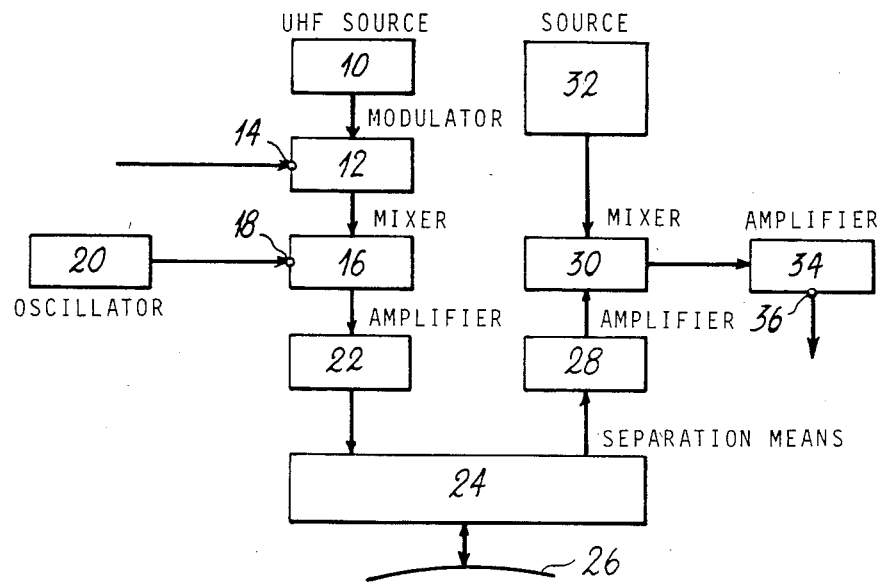
Figure 2:
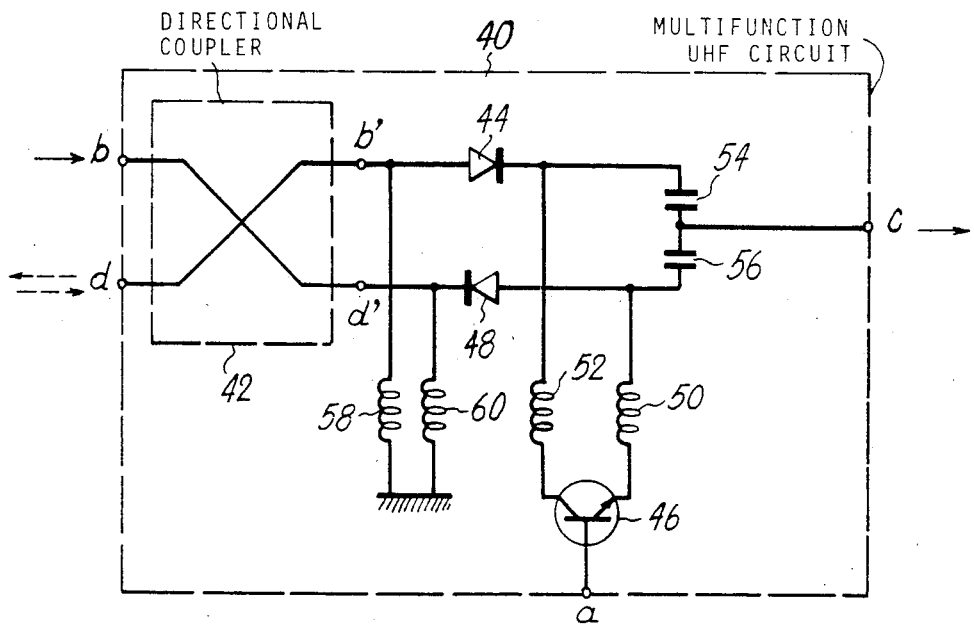
FIG. 2 the equivalent circuit diagram of the circuit according to the invention.

Circuit 40 shown in FIG. 2 comprises:

a 3 dB directional coupler 42 having a first pair of accesses b and d and a second pair of accesses b' and d';

a branch having in series a first diode 44, a transistor 46 and a second diode 48, transistor 46 having a base connected to an access (a) for controlling its conductive or blocking state, an emitter connected across a first rejection inductor 50 to diode 48 and a collector connected via a second rejection inductor 52 to the other diode 44, said branch being connected between accesses b' and d' of the coupler;

two capacitors 54, 56 connected to diodes 44, 48 and having a common armature connected to an access (c);

two lines also having one or more quarter-wave elements symbolically represented by two inductors 58, 60 positioned between the earth and diodes 44, 48.

The circuit operates in the following manner. When an infinite impedance is present at accesses b' and d' of the coupler, an ultra-high frequency wave applied to one of the accesses b or d is totally transmitted to the other. When an impedance of a special value, called the matching impedance, is present at accesses b' and d', an ultra-high frequency wave applied to accesses b or d of the first pair is then transmitted half to access b' and half to access d'. If two waves are applied to accesses b and d, they are mixed at the output c of the circuit. For example, the matching impedance can be 50 Ohms.

Between these two extreme dismatching and matching states and as a function of whether the impedance at terminals b' and d' is nearer to or further from the matching impedance, a wave applied to access b is transmitted to a greater or lesser extent to access d, the transmission coefficient being between 1 (mismatching) and zero (matching).

Diodes 44 and 48 have a point at earth with respect to the d.c. voltage by the bias of inductors 58, 60, which are in fact quarter-wave lines, which bring an infinite impedance to the frequency used, but which bring the earth potential into d.c. form.

When the transistor 46 is blocked, there is no d.c. polarization of the diodes, which behave in open circuit form and the ultra-high frequency wave is further reflected. When transistor 46 is conductive, the ultra-high frequency energy applied to access b polarizes the diodes in the forwards direction and the ultra-high frequency wave applied to access b and access d traverses the coupler and mixes on diodes 44, 48. At point c, the mixture of the two waves is collected across capacitors 54, 56.

Thus, the circuit can fulfil two different functions:

(1) If an ultra-high frequency wave is applied to access b, a transmission wave is obtained at access d, provided that transistor 46 is blocked. This state can be obtained by applying an appropriate voltage, e.g. a negative voltage to access (a) connected to the base. No wave is obtained at access d if transistor 46 is conductive, i.e. a signal suitable for unblocking the transistor applied to access (a) (e.g. a positive voltage). Thus, the circuit functions as a modulator, the wave applied to access b being the carried, the signal applied to access a being the information and the wave supplied by access d being the modulated wave. The modulation is of the all or nothing type if transistor 46 is blocked or not. The data which can be transmitted by such a modulator are then of the digital type (sequence of 0 and 1). It is merely necessary to connect access b to an ultra-high frequency source, access d to an antenna and access a to the data source. However, transistor 46 can be more or less conductive, modulation then being of the analog type.

(2) If an ultra-high frequency wave is present both at access b and at access d, the circuit behaves as a mixer, provided that transistor 46 is conductive. Access c receives the mixture of two waves and can be connected to an intermediate frequency processing circuit, said frequency being equal to the frequency difference of the two waves received. Access b is then connected to the reception source and access d to the antenna. The circuit is controlled by access a.

Figure 3:
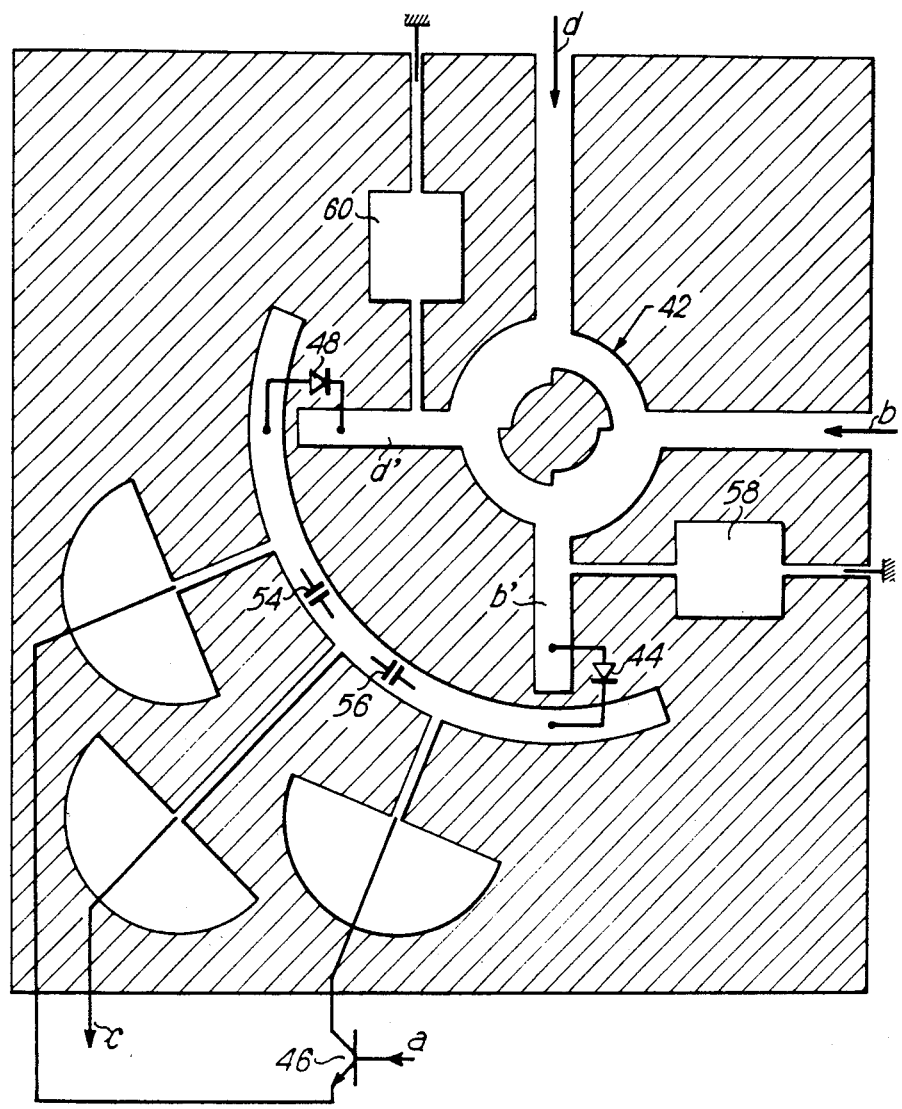
FIG. 3 the circuit according to the invention.

FIG. 3 shows a diagram of an embodiment of the circuit described hereinbefore. The size of the circuit is increased 8.5 times, which illustrates its small dimensions. The elements shown carry the same reference as in FIG. 2.

Figure 4:
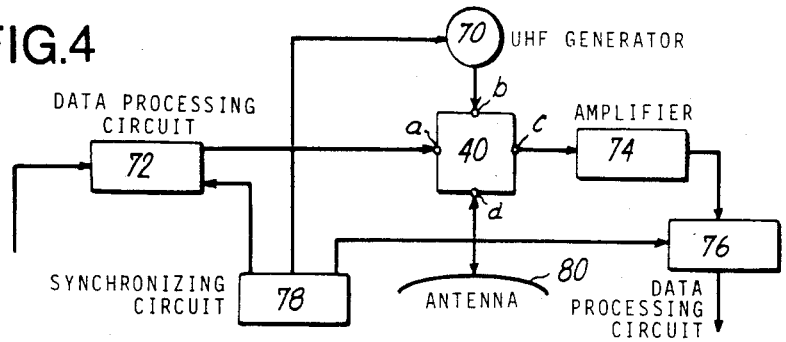
FIG. 4 a transmitter-receiver using the circuit of FIG. 3.

FIG. 4 shows a transmitter-receiver using the circuit according to the invention and which comprises:

an ultra-high frequency generator 70 able to alternately transmit a transmission wave and a reception wave, a first processing circuit 72 able to receive a continuous data stream e.g. of digital data, and supply the same data, but grouped in blocks, an amplifier-detector chain 74 operating at an intermediate frequency equal to the frequency difference between the transmission and reception waves, a second data processing circuit 76 connected to said chain and able to receive digital data grouped in blocks and supply the same data in the form of a continuous stream, a synchronizing circuit 78 controlling the first and second data processing circuits 72, 74 and the generator 70, an antenna 80.

Such an apparatus also requires means for alternately carrying out a function of modulating the transmission waves and mixing a received wave with the reception wave, and for carrying out a separation between the transmission waves directed towards the antenna and the reception wave coming from the antenna. According to the invention, these means are constituted by the aforementioned circuit 40, in which access a is connected to the first data processing circuit 72, access b to generator 70, access c to the amplifier-detector chain 74 and access d to antenna 80.

Figure 5:
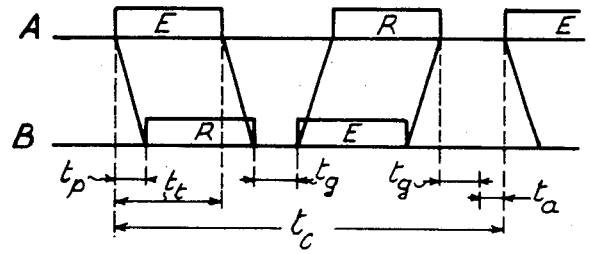
FIG. 5 a chronogram illustrating the operation of the aforementioned means.

The chronogram of FIG. 5 illustrates the operation of a half-duplex connection using two terminal stations A and B, which are both identical to the apparatus of FIG. 4. In FIG. 5, the notations have the following meanings:

E the transmission phase
R the reception phase
$t_t$ the time for transmitting a data block
$t_p$ the transit time from one end to the next
$t_g$ the hold time
$t_a$ the waiting time
$t_c$ the cycle time.

Thus, in such a system, circuit 40 fulfils the three functions of modulation during transmission phases, mixing during reception phases and transmission-reception separation.

Figure 6:
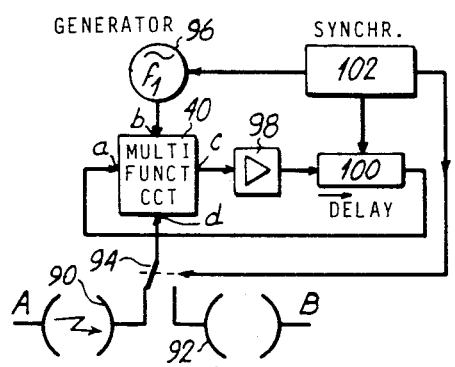
FIG. 6 a repeater using the circuit according to the invention.
Figure 6:
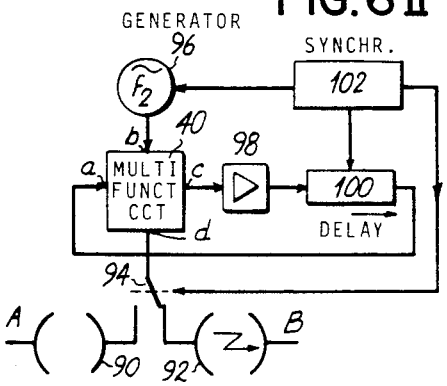
Figure 6:
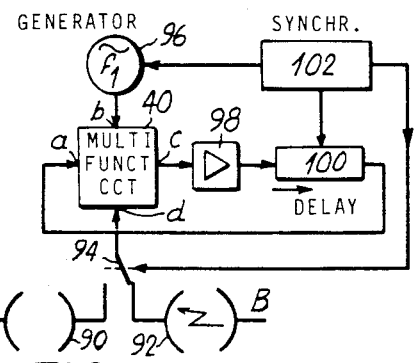
Figure 6:
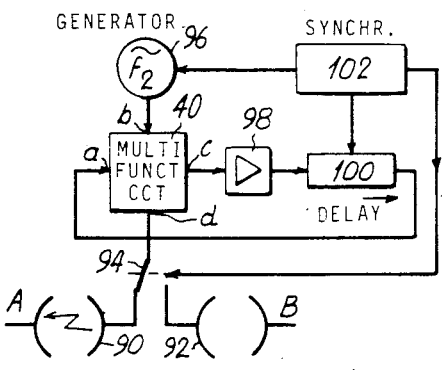

FIG. 6 shows a repeater comprising:

a first antenna 90, a second antenna 92, a branching or separating device 94 making it possible to put into operation any one of the antennas, an ultra-high frequency generator 96 able to alternately transmit a first ultra-high frequency wave at a first frequency $f_1$ and a second ultra-high frequency wave at a second frequency $f_2$, an amplifier-detector chain 98 operating at an intermediate frequency equal to the frequency difference between the first and second waves transmitted by the generator, a delay network 100 connected to chain 98, a synchronizing circuit 102 controlling generator 96, delay network 100 and branching device 94.

Such a repeater must also comprise means for alternately carrying out a modulation function of the first wave and the mixing of the second wave with a reception wave coming from one of the antennas and for performing a separation between the transmission wave and the reception wave. According to the invention, these means are constituted by the aforementioned circuit 40, in which access (a) is connected to delay network 100, access (b) to generator 96, access (c) to the amplifier-detector chain 100 and access (d) to branching device 94.

FIG. 6 represents the four possible phases for such a repeater (I, II, III, IV), as well as the two antennas A and B belonging to the preceding repeater and the following repeater. The operating principle is as follows:

Phase I: the repeater receives a modulated wave by its antenna 90. The reception wave is directed by branching device 94 to access d of circuit 40, which also receives a wave of frequency $f_1$ from generator 96. Circuit 40 functions as a mixer. The mixed wave is extracted from circuit 40 by access c and processed in circuit 98. The digital data are applied to circuit 100.

Phase II: generator 96 supplies a wave at frequency $f_2$. The data extracted from circuit 100 are applied to input (a) of circuit 40, which functions as a modulator. The branching device 94 connects antenna 92, which retransmits the modulated wave to the following repeater.

Phase III: this corresponds to phase I, the data coming on this occasion from the return channel.

Phase IV: this corresponds to phase II, the data taking the return channel.

Experimental work has been carried out on a link using two circuits according to the above description. The measured characteristics are as follows:

frequency: 22.15 GHz
flow rate: 22.15 GHz
radiated power: 40 mW
repeater gain: 85 dB
noise factor on reception: 10 dB
dynamics of the linear part of the modulation curve: higher than 20 dB.

Figure 7:
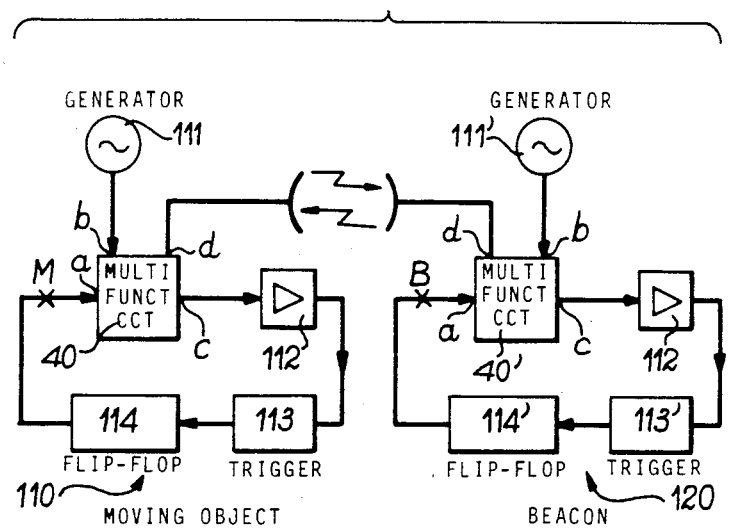
FIG. 7 a device for fixing the position of a moving object.

FIG. 7 shows a device for the position fixing of a moving object using the multifunction ultra-high frequency circuit according to the invention. The use of such a circuit on board a moving object makes it possible to measure the azimuth of a marker or beacon, as well as the distance from the latter. Thus, the position of the moving object can be spotmarked by a single bearing effected on a position fixing beacon.

Two solutions are possible with regards to distance measurement. The first, illustrated in FIG. 7, uses a moving object 110 and a beacon 120. The moving object carries the multifunction circuit 40, a generator 111, an amplifier 112, a trip mechanism 113 and a monostable flip-flop 114. The beacon carries identical elements, carrying the same references, but followed by an apostrophe.

By measuring the quench frequency fo modulating the head on the moving object side, it is possible to deduce therefrom the distance between the moving object and the beacon:

$$(1/fo) = (2d/c)$$

thus $$d = (c/2fo)$$

so that c is the velocity of light.

Figure 8:
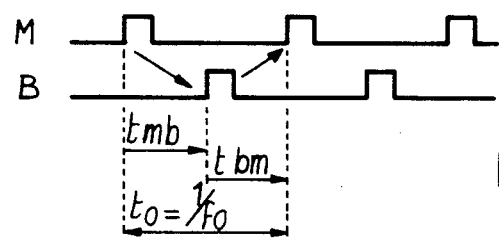
FIG. 8 the signals used in the aforementioned means.

Thus, the signals at M and B have the form shown in FIG. 8, where tmb is the transmission time from the moving object to the beacon and tbm the transmission time from the beacon to the moving object, so that therefore we obtain:

$$tmb + tbm = (2d/c) = (1/fo)$$

The second solution uses a multifunction circuit on the moving object side with an all or nothing modulation at frequencies ranging from f1 to f2, the beacon functioning as a responder. The frequency fo (f1 < fo < f2) for which the energy received by the ultra-high frequency head on the moving object side is minimum corresponds to a phase displacement of 180° between the transmitted pulses and the received pulses. Thus, we obtain:

$$(1/fo) = (2d/c)$$

thus $$d = (c/2fo)$$

The modulation process used makes it possible to obtain very simple bilateral repeaters constructed in the manner shown in FIG. 7 with a chain constituted by an amplifier, a trip mechanism and a monostable flip-flop inserted between accesses c and a, the transmitting-receiving antenna being connected to access d and the generator to access b.

Another application of the multifunction circuit according to the invention consists in the realisation of a telemetry system.

Figure 9:
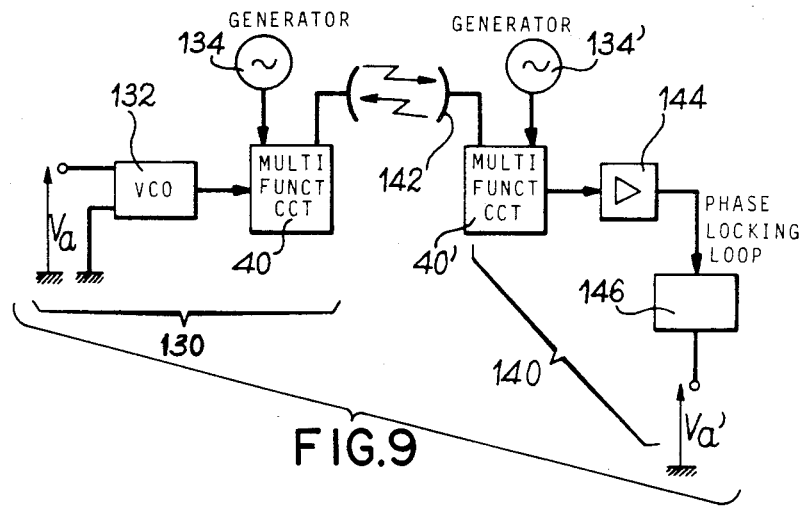
FIG. 9 a telemetry means.

The value Va of an analog voltage representing a magnitude to be measured is to be remotely transmitted. The connection principle is given by the diagram of FIG. 9.

On the measurement side 130, the circuit comprises a voltage-controlled oscillator 132 (V.C.O.) receiving the voltage Va to be transmitted, the circuit 40 according to the invention, a generator 134 and an antenna 136. On the reception side 140, there is an antenna 142, a circuit 40' according to the invention, a generator 134', an amplifier 144 and a phase locking loop 146, whose output supplies a voltage Va'.

This circuit functions in the following manner. The modulating frequency used on the measurement side 130 is controlled by the value to be measured Va. On the remote or reception side 140, the ultra-high frequency head is kept in reception in normal time. The phase locking loop 146 is dependent on the modulation frequency received, which restores a voltage Va' equal to voltage Va.

By using the multifunction circuit 40' on the remote side 140 in transmission, it is possible to supply a return control to the measuring end 130, e.g. for switching oscillator 132 to another quantity to be measured.

One of the interests of the systems described is that they can be given small dimensions, due to the small number of components used and the compactness of the multifunction ultra-high frequency circuit used and the possibly associated printed antenna.

What is claimed is:

1. A multifunction ultra-high frequency circuit, wherein it comprises:
    a 3 dB directional coupler having a first access (b), a second access (d), a third access (b') and a fourth access (d');
    a branch having in series a first diode, a transistor and a second diode, the transistor having a base connected to a fifth access (a) for controlling its conductive or blocking state, an emitter connected to a first rejection inductor to one of the diodes and a collector connected via a second rejection inductor to the other diode, said branch being connected between the third and fourth accesses of the coupler and having impedances equal to a matching value when the transistor is in the conductive state;
    two lines having at least one quarter-wave element connecting the earth to the two diodes;
    a sixth access (c) connected to the two diodes between two capacitors.

2. A transmitter-receiver means for bidirectional transmission, wherein it comprises:
    an ultra-high frequency generator able to alternately transmit a transmission wave and a reception wave;
    a first data processing circuit able to receive a continuous data stream and supply the data grouped in blocks;
    an amplifier-detector chain operating at an intermediate frequency equal to the frequency difference between the transmission and reception waves;
    a second data processing circuit connected to said chain and able to receive the data grouped in blocks and to supply the same data in the form of a continuous stream;
    a synchronizing circuit controlling the first and second data processing circuits and the generator;
    an antenna;
    and means for alternately modulating the transmission wave and mixing a received wave with the reception wave and for effecting a separation between the transmission wave directed towards the antenna and the received wave coming from the antenna, characterized in that these means are constituted by the circuit of claim 1 in which the fifth access (a) is connected to the first data processing circuit, the first access (b) is connected to the generator, the sixth access (c) is connected to the amplifier-detector chain and the second access (d) to the antenna.

3. A means according to claim 2, wherein the data are of the digital type.

4. A repeater comprising:
    a first antenna;
    a second antenna;
    a branching device making it possible to put into operation any one of said first and second antennas;
    an ultra-high frequency generator able to alternately transmit a first ultra-high frequency wave at a first frequency and a second ultra-high frequency wave at a second frequency;
    an amplifier-detector chain operating at an intermediate frequency equal to the frequency difference between the first and second waves transmitted by the generator;
    a delay network connected to the chain;
    a synchronizing circuit controlling the generator, the delay network and the branching device;
    means for alternately modulating the first wave and mixing the second wave with a reception wave coming from one of the antennas and for effecting a separation between the transmission wave and the reception wave, wherein these means are constituted by the circuit of claim 1, in which the fifth access (a) is connected to the delay network, the first access (b) is connected to the generator, the sixth access (c) is connected to the amplifier-detector chain and the second access (d) to the branching device.

5. A repeater, wherein it comprises the circuit according to claim 1 with, inserted between said sixth and fifth accesses (c) and (a), a chain comprising an amplifier, a trigger mechanism, a monostable flip-flop and wherein it comprises a generator connected to first access (b) and a transmitting-receiving antenna connected to second access (d).

6. A telemetry device, wherein it comprises a measurement side, comprising a circuit according to claim 1, fifth access (a) being connected to a voltage-controlled oscillator receiving a voltage to be measured, first access (b) to a generator, second access (d) to an antenna and a reception side, comprising a circuit according to claim 1, second access (d) being connected to an antenna, first access (b) to a generator, sixth access (c) to an amplifier followed by a phase locking loop, whose output supplies a voltage corresponding to the measured voltage.

* * * * *

UNITED STATES PATENT AND TRADEMARK OFFICE
CERTIFICATE OF CORRECTION

PATENT NO. : 4,566,132

DATED : January 21, 1986

INVENTOR(S) : Sylvain Meyer, Michel Goloubkoff, Jean Guéna

It is certified that error appears in the above-identified patent and that said Letters Patent is hereby corrected as shown below:

Column 4, line 15, "data" should be inserted after --first--.

Column 5, line 41, "flow rate: 22.15 GHz" should read
--flow rate: 2048 kbit/s--.

Signed and Sealed this

Twenty-second Day of July 1986

[SEAL]

Attest:

DONALD J. QUIGG

Attesting Officer     Commissioner of Patents and Trademarks